United States Patent [19]

Oyabu et al.

[11] Patent Number: 4,788,025
[45] Date of Patent: Nov. 29, 1988

[54] POWER SOURCE FOR NUCLEAR FUSION REACTOR

[75] Inventors: Isao Oyabu, Kobe; Satarou Yamaguchi, Hino, both of Japan

[73] Assignee: Mitsubishi Denki Kabushiki Kaisha, Tokyo, Japan

[21] Appl. No.: 801,804

[22] Filed: Nov. 26, 1985

[30] Foreign Application Priority Data

| Nov. 29, 1984 | [JP] | Japan | 59-250510 |
| Dec. 27, 1984 | [JP] | Japan | 59-274053 |
| Dec. 27, 1984 | [JP] | Japan | 59-274054 |
| Dec. 27, 1984 | [JP] | Japan | 59-274055 |
| Dec. 27, 1984 | [JP] | Japan | 59-274056 |

[51] Int. Cl.[4] ............................ G21B 1/00
[52] U.S. Cl. ............................ 376/143
[58] Field of Search ............... 376/119, 142, 143

[56] References Cited

FOREIGN PATENT DOCUMENTS

| 53-35897 | 4/1978 | Japan | 376/143 |
| 53-115496 | 10/1978 | Japan | 376/143 |
| 54-72995 | 6/1979 | Japan | 376/143 |
| 54-118995 | 9/1979 | Japan | 376/143 |
| 54-152793 | 12/1979 | Japan | 376/143 |
| 54-152794 | 12/1979 | Japan | 376/143 |
| 59-91392 | 5/1984 | Japan | 376/143 |
| 59-92385 | 5/1984 | Japan | 376/143 |
| 59-159087 | 9/1984 | Japan | 376/143 |
| 795417 | 1/1982 | U.S.S.R. | 376/143 |
| 830256 | 3/1960 | United Kingdom | 376/143 |

Primary Examiner—Deborah L. Kyle
Assistant Examiner—Richard L. Klein
Attorney, Agent, or Firm—Leydig, Voit & Mayer

[57] ABSTRACT

This invention provides a high power closing switch having a fast operating speed in the bypass of a main circuit switch for reducing the load share of the main circuit switch provided between a load coil and a power source circuit provided in a nuclear fusion reactor to simplify the construction of the main circuit switch formed heretofore of a number of parallel switches to reduce the value of the resistor of a clover circuit, thereby reducing the discharge current of the capacitor of the power source circuit.

19 Claims, 6 Drawing Sheets

POWER SOURCE FOR NUCLEAR FUSION REACTOR

BACKGROUND OF THE INVENTION

This invention relates to a power source for a nuclear fusion reactor and, more particularly, to a power source for a coil provided in a nuclear fusion reactor such as a reversed field pinch (RFP) apparatus.

Heretofore, as a prior-art power source of this type is known a constitution shown in FIG. 1. The power source will be described as an example with respect to a power source used for a nuclear fusion reactor such as a reversed field pinch (RFP) apparatus.

In FIG. 1, reference numeral 1 designates a power source, numeral 2 designates a capacitor Cr, numeral 3 designates a capacitor Cf, numerals 4 and 5 designate diodes $D_1$ and $D_2$, numeral 6 designates a resistor R, numeral 7 designates an ignitron Ig for forming a main circuit switch, and numeral 8 designates a load coil L.

In such a prior-art power source, the capacitors Cr 2 and Cf 3 are now charged by a charger (not shown) to predetermined voltages, respectively. For example, the former is charged to 20 kV, and the latter is charged to 3.3 kV. When a trigger signal is applied from a firing circuit (not shown) to the ignitron Ig 7, the ignitron Ig 7 is fired. Thus, a current I from the capacitor Cr 2 starts flowing to the load coil L 8. FIG. 2 shows a diagram of the relationship between the time and the load current illustrating the state that the current I alters with the time. This operation will be continuously explained with reference to FIG. 2. When the current I flows in some degree, the voltage of the capacitor Cr 2 decreases. When the voltage of the capacitor Cr 2 becomes equal to the voltage of the capacitor Cf 3, the current from the capacitor Cf 3 is applied through a diode $D_1$ 4, and flowed to the load coil L 8. This state is shown by a time point $t_r$ in FIG. 2. The current I then continues increasing and arrives at the peak value $I_0$ at a time point $t_0$. After the time point $t_0$, the currents from the capacitors Cr 2 and Cf 3 are eliminated, but a clover circuit is formed by the resistor 6, the diodes $D_2$ and $D_1$, the ignitron Ig 7 and the load coil L 8, and the current I flowed to the load coil L 8 continues flowing while gradually decreasing. The resistor R 6 is one type of a current limiting resistor inserted to restrict the allowable capacity of the ignitron Ig 7. Thus, in the prior-art power source in FIG. 1, the current change as shown by a solid line in FIG. 2 occurs.

In FIG. 2, the load current I in the time zone of $t=0$ to $t_r$ is that from the capacitor Cr 2, and the load current I in the time zone of $t=t_r$ to $t_0$ is that from both the capacitors Cr 2 and Cf 3. The current flowed after the time point $t_0$ is the current of the clover circuit, which flows through the clover circuit formed as described above.

The ignitron used in the prior-art power source of this type has a small current capacity an as high as approx. 100 coulomb per one even in the largest due to the restriction in the structure. Thus, the value of the resistor R of the clover circuit is set largely so as to rapidly decrease the current of the clover circuit for the load coil. However, since the early reduction in the current of the load coil shortens the time for closing a plasma generated in the nuclear fusion reactor, it is not preferable. Then, the resistor of the clover circuit is reduced so as to delay the reduction in the current of the clover circuit, and it is considered to connect a number of ignitrons in parallel so as to increase the current capacity of the ignitron. For example, when the ignitron is adopted as a power source for a RFP apparatus, approx. 10 ignitrons are connected in parallel. However, in such a case, a problem arises that gate circuits and DC power sources for the ignitrons are necessarily increased that much, thereby causing the cost to increase and the profile to be increased in size. Further, it is also considered to utilize SCRs as a main circuit switch, but since the voltage of the capacitor in the circuit is high, another problem arises that it is necessary to use several parallel connections of SCRs connected in series, thereby causing the cost to increase.

SUMMARY OF THE INVENTION

This invention has been made in order to eliminate the problems of the prior art as mentioned above, and has for its object to provide a power source for a nuclear fusion reactor in which a high power (capacity) closing switch is cooperatively arranged to suppress the reduction in the current flowing to the load coil without increasing the current capacity and the number of main circuit switches.

BRIEF DESCRIPTION OF THE DRAWINGS

In the drawings, the same symbols indicate the same or corresponding parts.

DESCRIPTION OF THE PREFERRED EMBODIMENTS

Figure 1:
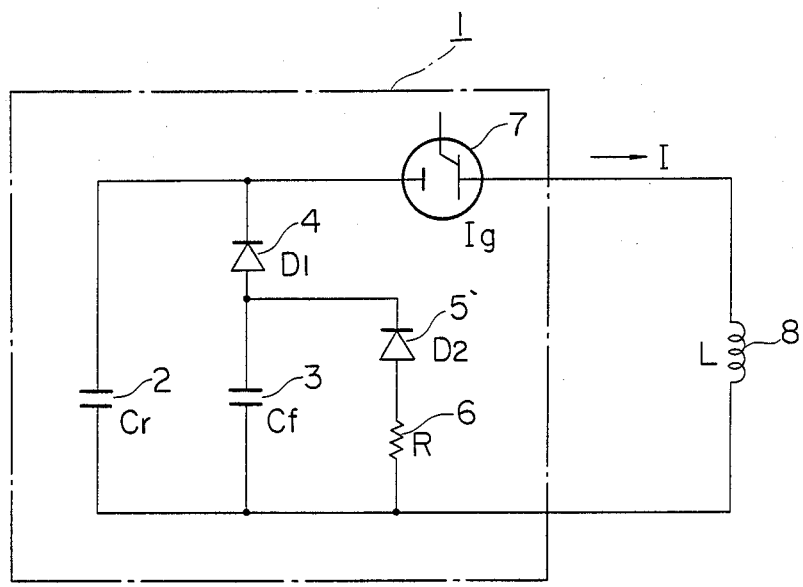
FIG. 1 is a circuit diagram of a power source for a prior-art nuclear fusion reactor.

Now, an embodiment of this invention will be described with reference to FIG. 3, and the same symbols as those in FIG. 1 indicate the same or corresponding parts. Reference numeral 101 designates a high power closing switch connected in parallel with the ignitron Ig 7.

Figure 2:
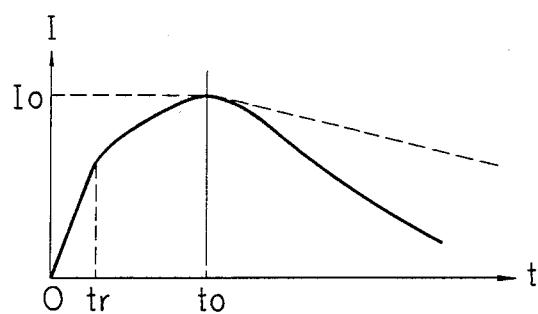
FIG. 2 is a diagram showing the relationship between the time and the load coil current.

The operation of this embodiment will be described with reference to the diagram of the relationship between the time and the load current in FIG. 2. When a predetermined input signal is first applied to a gate circuit (not shown) of the ignitron Ig 7 at a timing of $t=0$, the ignitron Ig 7 is fired, and the current form a rising capacitor Cr 2 is flowed only through the ignitron Ig 7 to the load coil L 8. Then, the current from the clover capacitor Cf 3 is also flowed through the ignitron Ig 7 to the load coil L 8 at a timing of $t=t_r$. Then, when the high power closing switch 101 is closed at a timing of $t=t_0$, most of the current to the load coil L 8 is supplied through the high power closing switch 101 having less voltage drop between the contacts after the time point $t_0$. Since the high power closing switch 101 is provided, the value of the resistor 6 can be reduced, the current change of the load coil L 8 becomes as indicated by a broken line in FIG. 2, thereby decreasing the degree of reducing the current.

Since the high power closing switch has in general a complicated mechanism, the operating time from when receiving a closing command to when completing the closing is irregular, and the closing accuracy of the high power closing switch is rough. Thus, the high power closing switch used in this invention requires to perform the accurately closing operation at a predetermined time point.

In case of the power source for the RFP apparatus, $t_r=$ 2 msec., the time point $t_0=$approx. 6 msec., and the current flowing time after the time point $t_0$ is approx. 100 msec.

Figure 4:
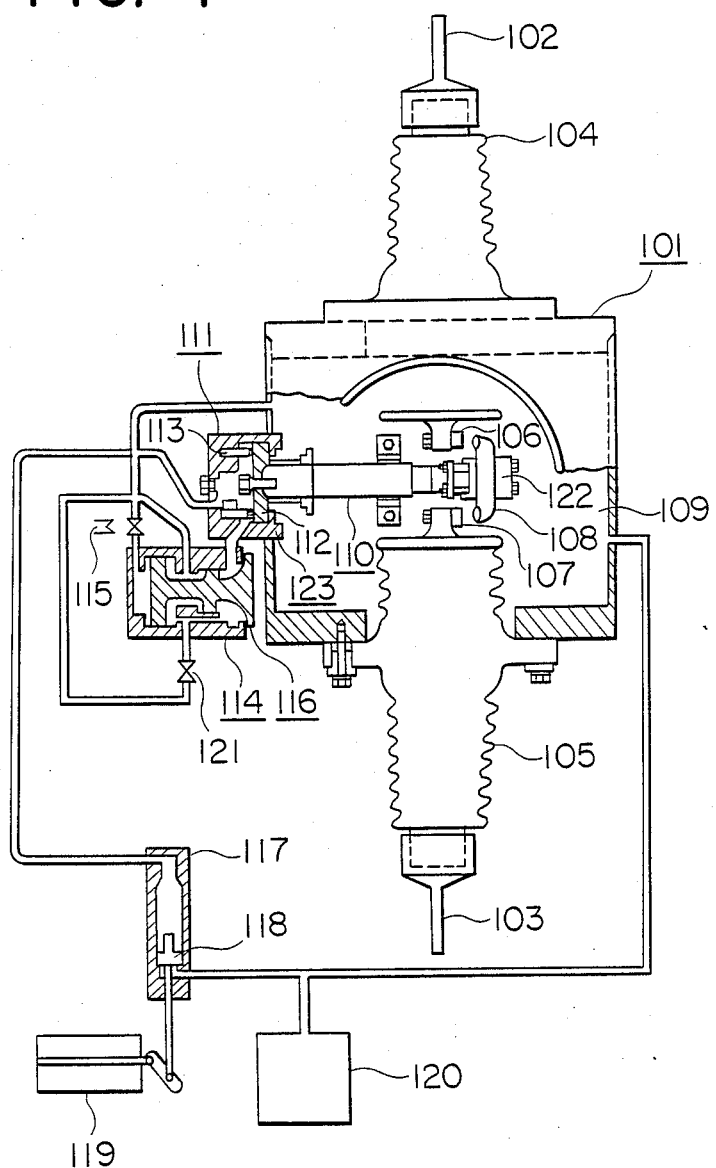
FIG. 4 is a view showing the construction of a high power closing switch used for the embodiment of the invention.

FIG. 4 shows the construction of a high power closing switch preferably used in this invention. In FIG. 4, reference numeral 101 designates a high power closing switch, numerals 102 and 103 designate terminals, numerals 104 and 105 designate contact supporting members, numerals 106 and 107 designate stationary contacts, numeral 108 designates a movable contact, and numeral 109 designates a tank. The contacts 106, 107 and 108 are contained in the tank 109, and the contact supporting members 104 and 105 are mounted in the tank 109. The main circuit current path of the high power closing switch 101 has the terminal 102, the contact supporting member 104, the stationary contact 106, the movable contact 108, the stationary contact 107, the contact supporting member 105 and the terminal 103, and the current flows in this sequence. Reference numeral 110 designates a movable contact assembly, numeral 111 designates a cylinder, numeral 112 designates a piston, numeral 113 designates a spring, numeral 114 designates a control valve, numeral 115 designates a closing solenoid valve, numeral 116 designates a piston, numeral 117 designates an actuating cylinder for an auxiliary switch, numeral 118 designates a piston, numeral 119 designates an auxiliary switch, numeral 120 designates a compressed air source, numeral 121 designates a tripping solenoid valve, numeral 122 designates a rubber spring, and numeral 123 designates an actuating valve.

In the high power closing switch shown in FIG. 4, the movable contact assembly 110 moves to the right side of FIG. 4, and the stationary contacts 106, 107 and the movable contact 108 are interrupted therebetween. Further, a predetermined pneumatic pressure (e.g., 10 kg/cm²) is applied from the compressed air source 120 to the tank 109, the control valve 114 is closed, and equal pneumatic pressure is applied to both sides of the piston 112. The piston 112 is fully pressed to the left side by the force of the spring 113, the movable contact assembly 110 is moved in response to the pressing, and the stationary contacts 106, 107 and the movable contact 108 are opened therebetween. On the other hand, when the control valve 114 is opened, the left side of the piston 112 is opened with the atmospheric pressure. Thus, the piston 112 is pressed by the pneumatic pressure of the tank 109, the movable contact assembly 110 is moved to the left side, and the stationary contacts 106, 107 and the movable contact 108 are closed therebetween.

Figure 3:
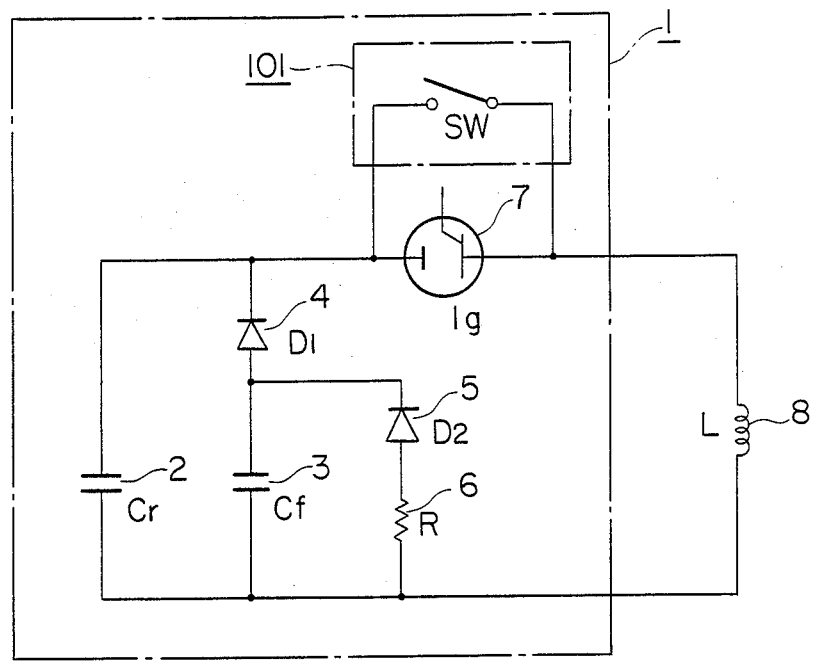
FIG. 3 is a circuit diagram showing a power source for a nuclear fusion reactor according to an embodiment of this invention.

The high power closing switch 101 of FIG. 3 is now interrupted, and when a predetermined closing signal is inputted to the high power closing switch 101, a closing control current for the closing solenoid valve 115 is flowed to open the closing solenoid valve 115, the compressed air is fed to the control valve 114 side, the piston 116 is pressed to the right side, and the control valve 114 is opened. The compressed air in the cylinder 111 and the actuating cylinder 117 for the auxiliary switch are exhausted, the piston 112 is moved to the left side by the pneumatic pressure in the tank 109, and the movable contact assembly 110 is arrived at the position of the closed state.

On the other hand, with respect to the operating cylinder 117 for the auxiliary switch, the piston 118 is operated by the pneumatic pressure in the tank 109, the closing signal is turned OFF by the auxiliary switch 119 mechanically linked to the piston 118 to close the closing solenoid valve 115. The control valve 114 is continuously held due to its self-holding function at this time, and the contacting pressure between the stationary contacts 106, 107 and the movable contact 108 is held at a predetermined degree by the pneumatic pressure in the tank 109. The tripping solenoid valve 121 remains closed.

The high power closing switch constructed and operated as described above has a long lifetime and a low cost capable of closing the high voltage and the high current at an accurate timing. The high power closing switch seals a contact portion in the high pressure tank with the compressed air, and operates the relative control valve by the compressed air to drive the opening and closing of the contact portion, thereby reducing the irregularity in the closing time. Then, since the contact portion of the high power closing switch is sealed in the tank in which the compressed air is filled as described above, it produces a low noise. Since the contact portion is provided in the high pressure tank, it can endure against a high voltage (e.g., AC 60 kV) through it has a small interval between the contacts (e.g., 7 mm). Further, rapid closing operation can be performed since it has a small interval between the contacts. The high power closing switch has a control valve having high efficiency of opening with the air at the closing time, the movable contact is formed lightly, the movable distance is short, and the spring pressure when the contacts contact is suitably controlled, thereby performing a considerably accurate closing time (e.g., ±0.35 msec.) though mechanical contact.

Further, the control valve has a self-holding function, and the closing solenoid valve and the tripping solenoid valve for controlling the piston of the control valve are held after the completion of the operation merely by feeding the air only at the operation starting time. Thus, the compressed air consumption may be less, and the capacity of the solenoid valves can be reduced.

Figure 5:
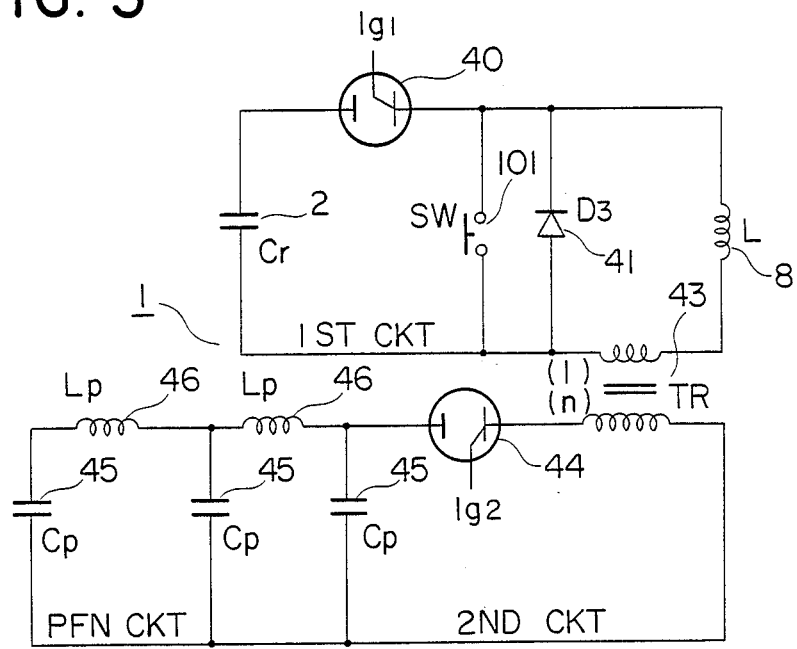
FIG. 5 is a circuit diagram showing a power source for a nuclear fusion reactor according to another embodiment of this invention.

FIG. 5 shows another embodiment of this invention in which a fast circuit (first circuit) and a slow circuit (second circuit) are separated by a stepdown transformer. More particularly, the current of the clover circuit to the load coil and the current from the slow circuit are flowed to a high power closing switch provided relative to a main switch. In FIG. 5, the same symbols as those in FIGS. 3 and 4 indicate the same or corresponding parts. In FIG. 5, a current rising capacitor Cr 2 as a fast circuit is connected through an ignitron $Ig_1$ 40 to a parallel circuit which has a high power closing switch SW 101, a clover diode $D_3$ 41 and a load coil L 8, thereby forming a first circuit. Reference numeral 43 designates a stepdown transformer TR, the secondary side of which is inserted between the load coil L 8 and the clover diode $D_3$ 41, and the primary side of which is inserted into a PFN circuit as a slow circuit to be described in detail. The turn ratio of the primary side to the secondary side of the stepdown transformer TR 43 is n:1. Thus, the current flowed to the load coil L 8 provided at the secondary side of the transformer TR 43 is multiplied by n from the current of the primary side of the transformer. The reasons of this construction are because the capacitor of relatively high withstand voltage can be obtained inexpensively, and the primary side current value may be low so that particular attention may not be paid for circuit resistors. Then, the PFN circuit is of 3 stage type formed of a series inductor Lp 46 and a parallel capacitor Cp 45, and connected through an ignitron $Ig_2$ 44 to the primary side of the stepdown transformer TR 43, thereby forming a second circuit.

Figure 6A:
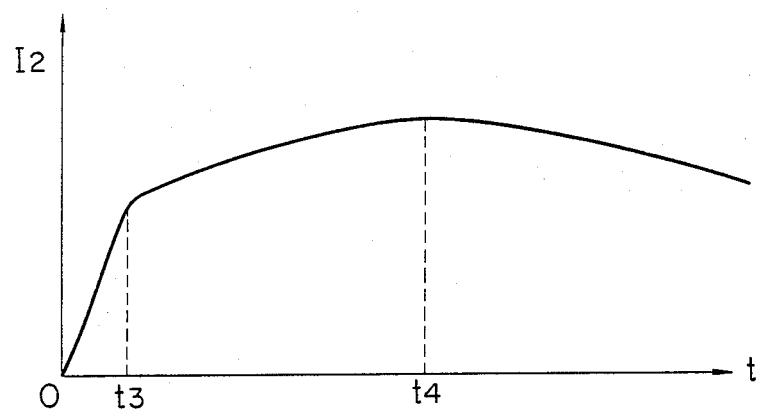
FIG. 6(A) is a diagram showing the relationship between the time and the load current with respect to FIG. 5.
Figure 6B:
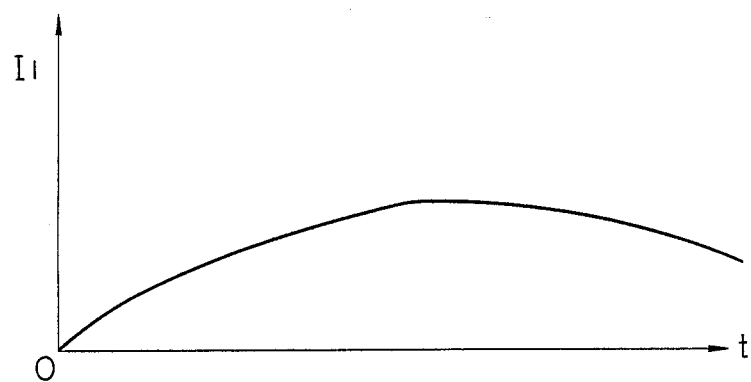
FIG. 6(B) is a diagram showing similarly the relationship between the time and the primary side current of a stepdown transformer.

Then, FIGS. 6(A) and 6(B) are diagrams showing discharge waveforms of the embodiment in FIG. 5 described above, wherein FIG. 6(A) shows the relationship between the time and the load coil current $I_2$, and FIG. 6(B) shows the relationship between the time and the primary side current of the stepdown transformer ($I_1$).

The operation of FIG. 5 will be described with reference to the diagram of the discharge waveform of FIG. 6. When the ignitron $Ig_1$ 40 is now closed, the capacitor Cr 2 starts discharging, and the current $I_2$ flowed to the load coil L 8 abruptly rises as shown from the time point $t=0$ to $t=t_3$ of FIG. 6(A). On the other hand, when the capacitor Cr 2 starts discharging, the ignitron $Ig_2$ 44 provided at the primary side of the stepdown transformer Tr 43 is also closed, and the current starts flowing. Thus, a pulse output of long time by a slowly rising current $I_1$ is obtained from the primary side of the stepdown transformer TR 43. The current flowed to the load coil L 8 at this time flows through the diode $D_3$ 41 after the time point $t=t_3$. Then, the high power closing switch SW 101 is closed slightly after the time point $t=t_3$ so that most of the current flowed to the load coil L 8 flows to the high power closing switch SW 101. In FIG. 6(A), since the time zone $t_3$ to $t_4$ is normally approx. 10 msec. or longer, the high power closing switch SW 101 having approx. ±0.35 msec. of the closing accuracy can sufficiently operate accurately.

In the embodiments of this invention described above, the PFN circuit provided at the primary side of the stepdown transformer TR 43 is formed in 3 stage type. However, this invention is not limited to the particular embodiments. For example, arbitrary stages including one stage may be employed.

Figure 7:
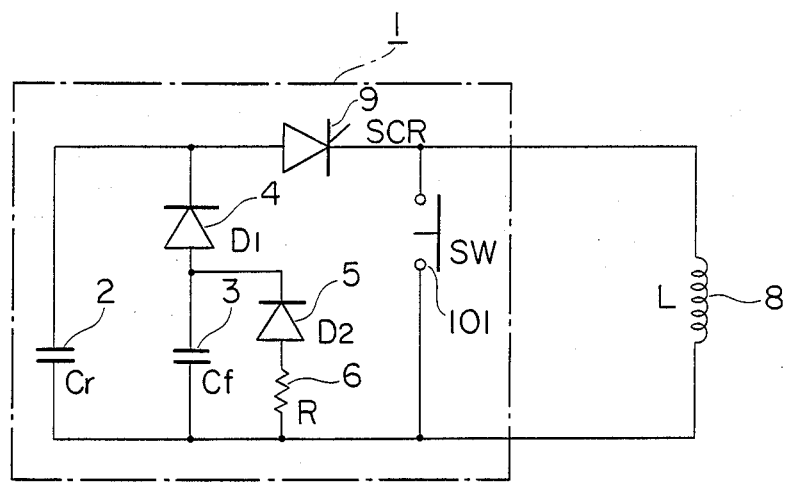
FIGS. 7 to 10 are circuit diagrams showing the embodiments of the invention.

FIG. 7 shows still another embodiment of this invention, wherein the same symbols as those in FIG. 3 indicate the same or corresponding parts. In this embodiment, a thyristor SCR 9 is used as a main switch, and a high power closing switch SW 101 is connected in parallel with a load coil L 8.

The operation of this embodiment will be described with reference to the diagram of the relationship between the time and the load current of FIG. 2. A rising capacitor Cr 2 and a capacitor Cf 3 are charged in advance by a charger (not shown) to a predetermined voltage. When the thyristor SCR 9 of the main switch is closed, a fast rising current flows as a discharge current from the capacitor Cr 2. A diode $D_1$ 4 is closed at a time point $t=t_r$, and a current from the capacitor Cf 3 is flowed. When the voltage of the capacitor Cf 3 becomes 0 volt (the time point $t=t_0$), the current is flowed from the clover circuit through a diode $D_2$ 5 and a resistor R 6. The timing change of the current near the time point $t=t_0$ is small. The high power closing switch SW 101 is closed at this time point. Thus, most of the current flowed to the load coil L 8 is flowed to the high power closing switch SW 101. In this embodiment, since the resistor R 6 is very low value, the attenuation of the current flowed to the load coil L 8 is extremely smooth, and the waveform shown by a broken line in FIG. 2 is obtained.

Figure 8:
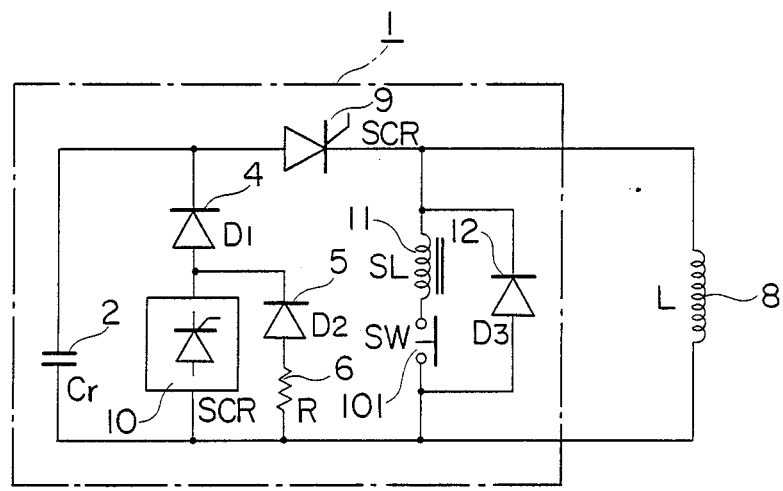

FIG. 8 shows still another embodiment of this invention. A protecting saturable reactor SL 11 is connected in series with a high power closing switch SW 101. This reactor SL 11 is a nonlinear element for temporarily limiting the current when the pressure between the contacts of the high power closing switch SW 101 is not sufficient or when the contacts repeatedly open and close at a high speed. A diode $D_3$ 12 is provided in parallel with the reactor SL 11 and the high power closing switch SW 101, thereby accurately determining the time point of the current flowed to the clover circuit. Further, in FIG. 8, a thyristor power source SCR 10 is used instead of the capacitor Cf 3 as the current source of FIG. 7. In this embodiment, the diode $D_3$ 12 connected in parallel with the high power closing switch SW 101 may be a thyristor.

Figure 9:
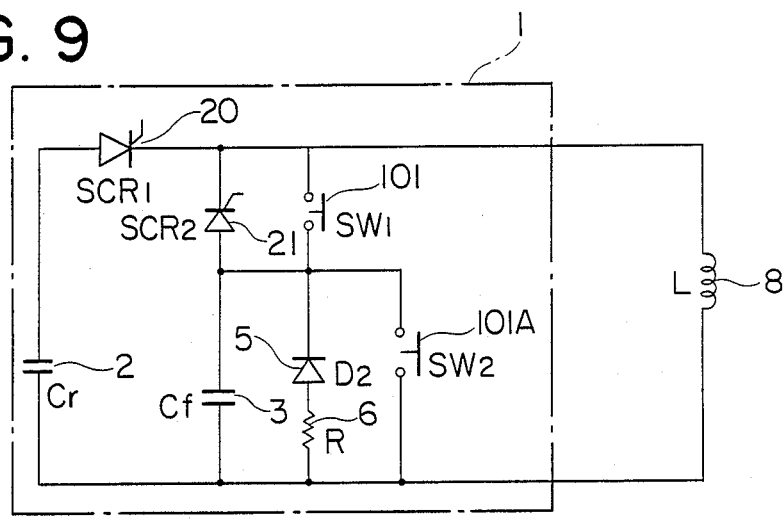

FIG. 9 shows still another embodiment of this invention, wherein the same symbols as those in FIG. 3 indicate the same or corresponding parts. In FIG. 9, a first switch $SCR_1$ 20 and a second switch $SCR_2$ 21 are used instead of the ignitron Ig 7 and the diode $D_1$ 4 of FIG. 3. The high power closing switch $SW_1$ 101 and $SW_2$ 101A are connected in parallel with the $SCR_2$ 21 of the former high power closing switch $SW_1$ 101, and the latter high power closing switch $SW_2$ 101A is connected in parallel with the series connection of a diode $D_2$ 5 and a resistor R 6.

The operation of the embodiment shown in FIG. 9 will be described with reference to the relationship between the time and the load current of FIG. 2. The $SCR_1$ 20 is first turned ON to start flowing a current at a timing of $t=0$. The voltage of the rising capacitor Cr 2 becomes equal to the voltage of the capacitor Cf 3 at the time point $t=t_r$, and the $SCR_2$ 21 is turned ON. Then, the high power closing switch $SW_1$ 101 is closed at the time point of the time zone $t_r$ to $t_0$. Then, the voltages of the capacitor Cr 2 and the capacitor Cf 3 become substantially 0 volt at the time point $t=t_0$, and the current flowed to the high power closing switch $SW_1$ 101 is flowed through the diode $D_2$ 5 and the resistor R 6. The high power closing switch $SW_2$ 101A is closed after this time point, and most of the current flowed to the diode $D_2$ 5 and the resistor R 6 flows to the high power closing switch $SW_2$ 101A. Then, the flowing time of the current continues for 100 msec. or longer. In this embodiment, the capacitor Cf 3 may employ a thyristor power source in the same manner as the embodiment in FIG. 8. The high power closing switch $SW_2$ 101A which has the closing accuracy of approx. ±0.35 msec. may be sufficient. The flow current capacity exceeds 10,000 coulomb and this high power closing switch is sufficient in this respect.

Further, since the closing time accuracy of the ignitron or thyristor used as a main switch is in the order of microseconds, the timing of starting the discharge is taken by the main switch, the high power closing switch having the closing time accuracy of ±0.35 msec. is closed after the time point $t=t_0$ to perform the clover, thereby operating sufficiently accurately.

Figure 10:
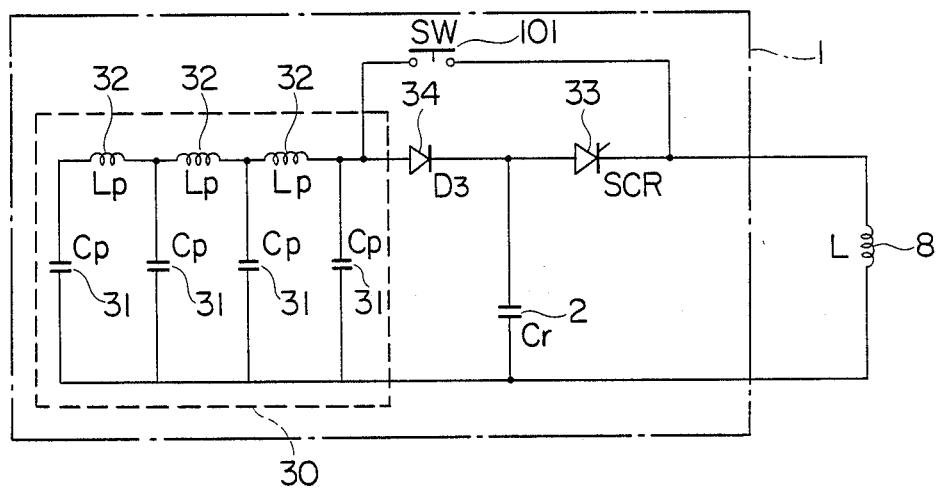
Figure 11:
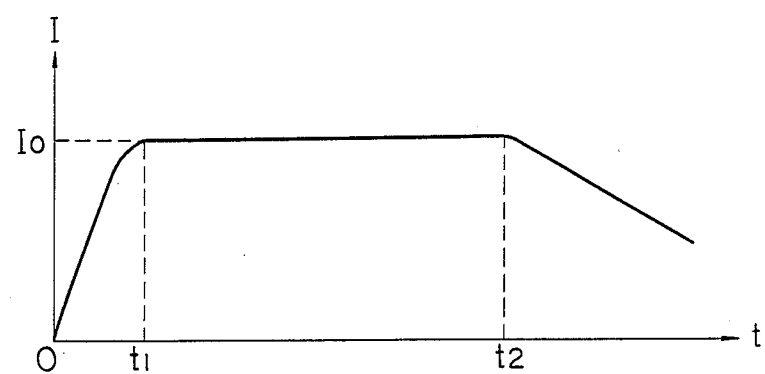
FIG. 11 is a diagram showing the relationship between the time and the load coil current in the embodiment of FIG. 10.

FIG. 10 shows still another embodiment of this invention, wherein the same symbols as those in FIG. 3 indicate the same or corresponding parts. FIG. 11 shows a diagram showing the relationship between the time and the load current of the load coil in this embodiment.

In FIG. 10, a PFN circuit 30 has capacitors Lp 31 and discharge time regulating inductors Cp 32 connected in suitable number in parallel with each other for large capacity and low charging voltage PFN circuit, and the PFN circuit 30 is connected in parallel with the capacitor Cr 2 through a diode $D_3$ 34. The capacitor Cr 2 is connected through a main switch SCR 33 with the load coil L 8, and a high power closing switch 101 is connected in parallel with a series circuit of the diode $D_3$ 34 and the main switch SCR 33.

The operation of FIG. 10 will be described with reference to FIG. 11. The capacitor Cr 2 of the power source 2 is charged in advance to a predetermined high voltage. When the main switch SCR 33 is now closed, the capacitor Cr 2 starts discharging to the load coil L 8. The discharging current rapidly rises, the voltage of the rising capacitor Cr 2 becomes equal to the voltage of the capacitor Cp 31 for the PFN circuit near the time point $t_1$, the diode $D_3$ 34 is closed, the current starts flowing from the PFN circuit 30 to the load coil L 8, thereby obtaining a flat current waveform as recognized between the time points $t_1$ and $t_2$. The time width to the time point $t_2$ is large, and may arrive at 10 msec. to 500 msec. Thus, the current flowed to the main switch SCR 33 and the diode $D_3$ 34 increases. Then, the high power closing switch SW 101 is closed, for example, in the closing time accuracy of ±0.35 msec. immediately after the time point $t_1$. Since the contacts of the high power closing switch SW 101 are formed in a metal contact, the resistance is much smaller than a switch element such as an ignitron, a thyristor or a diode, and most of the current is flowed through the high power closing switch SW 101.

In the embodiments described above, the thyristor has been used as the main switch. However, this invention is not limited to the particular embodiments. For example, the ignitron may be used. The diode used in general as a switch element may be replaced with other suitable element.

Further, in the embodiments described above, the high power closing switch has been connected in parallel with the switch element. However, since the high power closing switch of this type does not have in general considerably large contacting pressure of the contacts immediately after contacting, an arc tends to occur. Thus, a nonlinear element such as a saturable reactor is connected in series with the high power closing switch, thereby limiting the current flowed to the high power closing switch for a short time to increase the lifetime.

According to this invention as described above, the high power closing switch is connected in parallel with the ordinary main switch such as, for example, the ignitron or the thyristor to provide the power source for the nuclear fusion reactor capable of stably discharging over a long time without using a number of ignitrons, thyristors or diodes. Thus, the power source of this type having a low cost and high reliability can be carried out.

What is claimed is:

1. In a nuclear fusion reactor having a load coil, a power source comprising:
    a current source having a capacitor for supplying a rising current through a main circuit switch to said load coil for supplying a current to said load coil together with the current of said capacitor after starting discharging of said capacitor,
    a clover circuit having a series connection unit of a resistor and a diode for forming a circuit of an attenuating current flowed to said capacitor and said load coil upon completion of flowing the current of said current source,
    a contact unit having a tank sealed with compressed gas, a stationary contact, and a movable contact contained in the tank, and
    a closing switch having a control valve for controlling the opening and closing of said contact unit and an actuating valve for operating the movable contact in response to the operation of said control valve for bypassing said main circuit switch in high closing accuracy after a predetermined time from the start of discharging said capacitor, 2. A power source according to claim 1 wherein said current source has a capacitor, and the capacitor is connected in parallel with said rising capacitor.

3. A power source according to claim 1 wherein said current source has a SCR power source, and the SCR power source is connected in parallel with said rising capacitor through a diode.

4. A power source according to claim 1 wherein said main circuit switch includes an ignitron.

5. A power source according to claim 1 wherein said main circuit switch includes a SCR.

6. A power source according to claim 1 wherein the series connection unit of said resistor and said diode of said clover circuit is connected in parallel with said current source.

7. A power source according to claim 1 wherein a saturable reactor of nonlinear element is connected in series with said closing switch.

8. In a nuclear fusion reactor having a load coil, a power source comprising:
    a first circuit having a rising capacitor connected through a first main switch with a clover diode and a load coil connected in parallel, and
    a second circuit having a PFN circuit connected with a second main switch,
    said first and second circuits being connected through a transformer, and
    a closing switch connected in parallel with a clover diode in said first circuit.

9. A power source according to claim 8 wherein said transformer is a stepdown transformer.

10. A power source according to claim 8 wherein said transformer is an autotransformer.

11. A power source according to claim 8 wherein said first and second main switches are ignitrons.

12. In a nuclear fusion reactor having a load coil, a power source comprising:
    at least one main switch for supplying current to said load coil;

a capacitor coupled to said main switch for supplying a rising current through said main switch;

means for supplying current to said load coil when the voltage of said capacitor equals a first value; and bypass means for selectively passing current which flows through said load coil around said main switch, said bypass means including a closing switch having a tank which is sealed with compressed gas and contains a stationary contact and a movable contact, a control valve which controls the opening and closing of said contacts, and an actuating valve which operates said movable contact in response to the operation of said control valve.

13. A power source according to claim 12 wherein said main switch comprises an ignitron, wherein said closing switch is arranged in parallel across said ingitron, wherein said capacitor comprises a first capacitor and said current supplying means includes a second capacitor and a diode connected in series across said first capacitor, and wherein the power source further comprises a resistor and a diode connected in series across said second capacitor.

14. A power source according to claim 12 wherein said main switch comprises an SCR, wherein said closing switch is arranged in parallel across said load coil, wherein said current supplying means includes a diode and a source of current connected in series across said capacitor, and wherein the power source further comprises a resistor and a diode connected in series across said source of current.

15. A power source according to claim 14 wherein said capacitor comprises a first capacitor and wherein said source of current comprises a second capacitor.

16. A power source according to claim 14 wherein said source of current comprises a thyristor power source.

17. A power source according to claim 14 wherein said bypass means further includes a protecting reactor connected in series with said closing switch and a diode connected across said closing switch and said protecting reactor.

18. A power source according to claim 12 wherein said main switch comprises a first SCR, wherein said capacitor comprises a first capacitor and said current supplying means includes a second SCR and a second capacitor connected in series across the first capacitor and the first SCR, wherein the power source further comprises a resistor and a diode connected in series across the second capacitor, and wherein said bypass means comprises a first closing switch connected across the second SCR and a second closing switch connected across said resistor and said diode.

19. A power source according to claim 12 wherein said main switch comprises and SCR, wherein said current supplying means includes a diode and a PFN circuit connected in series across said capacitor, and wherein said closing switch is connected across said diode and said SCR.

* * * * *